United States Patent [19]
Ginn et al.

[11] Patent Number: 6,097,277
[45] Date of Patent: Aug. 1, 2000

[54] RESISTOR NETWORK WITH SOLDER SPHERE CONNECTOR

[75] Inventors: Steven N. Ginn, Granger; James N. Hufford; John Zdanys, Jr., both of Elkhart; Stephen W. Burry, Berne; Lewis L. Seffernick, Decatur; Robert M. VandenBoom, Markle, all of Ind.

[73] Assignee: CTS, Elkhart, Ind.

[21] Appl. No.: 09/186,453

[22] Filed: Nov. 5, 1998

[51] Int. Cl.[7] ........................................ H01C 1/01
[52] U.S. Cl. ................... 338/320; 338/309; 338/329; 338/239
[58] Field of Search ............................ 338/320, 309, 338/329, 239, 324, 325, 327, 332, 313

[56] References Cited

U.S. PATENT DOCUMENTS

| | | | |
|---|---|---|---|
| 3,849,757 | 11/1974 | Khammous et al. | 338/320 |
| 4,300,115 | 11/1981 | Ansell et al. . | |
| 4,332,341 | 6/1982 | Minetti . | |
| 4,654,628 | 3/1987 | Takayanagi . | |
| 4,658,234 | 4/1987 | Takayanagi . | |
| 4,757,610 | 7/1988 | McElheny et al. | 29/832 |
| 4,759,491 | 7/1988 | Fisher | 228/180 |
| 4,945,399 | 7/1990 | Brown et al. . | |
| 5,216,404 | 6/1993 | Nagai et al. . | |
| 5,379,190 | 1/1995 | Hanamura et al. . | |
| 5,450,055 | 9/1995 | Doi | 338/332 |
| 5,539,186 | 7/1996 | Abrami et al. . | |
| 5,557,502 | 9/1996 | Banerjee et al. . | |
| 5,621,619 | 4/1997 | Seffernick et al. . | |
| 5,661,450 | 8/1997 | Davidson . | |
| 5,796,038 | 8/1998 | Manteghi | 174/52.4 |

*Primary Examiner*—Michael L. Gellner
*Assistant Examiner*—Richard K. Lee
*Attorney, Agent, or Firm*—Mark P. Bourgeois

[57] ABSTRACT

A resistor network has a substrate with top and side surfaces. Resistors are located on the side surfaces. Several side conductors are located on the side surface and are electrically connected to the resistors. Several top conductors are located on the top surface and are electrically connected to the side conductors. Each top conductor has a cavity. A solder sphere is partially located in the cavity and is electrically and mechanically connected to the top conductor by reflowed solder paste. A cover coat covers the side conductors and the resistors. The resistor network provides a high density of resistors per unit area.

1 Claim, 2 Drawing Sheets

RESISTOR NETWORK WITH SOLDER SPHERE CONNECTOR

BACKGROUND OF THE PREFERRED EMBODIMENT(S)

1. Field of the Preferred Embodiment(s)

This invention generally relates to resistors for electronics. Specifically, the invention is a group of resistors mounted in a high density network or array package using spherical solder connections.

2. Description of the Related Art

Resistor networks are commonly used to terminate high speed digital signal lines to minimize unwanted reflections back through the transmission structure which is typically a printed circuit board. In most applications, the terminations are made by placing a resistor with a resistance matching the impedance of the transmission line, at the end of the transmission line. One end of the resistor is connected to a common termination voltage and the other end is connected to the signal line. For these applications, a bussed resistor network is a convenient solution, since one end of the termination is common to all signal lines.

The previous resistor network designs include surface mount, and through hole SIP and DIP versions.

Despite the advantages of each type of prior art resistor network, none have been easily or economically manufactured with a high density of interconnects per unit area on a printed circuit board. In particular, providing the resistors on the top of the resistor network causes the electrical leads to be tightly spaced on the edge of the device, while the area on the sides of the device is unused.

Therefore, there is a current unmet and heretofore long felt need for a resistor network with higher density, low cross-talk noise and improved signal integrity.

DESCRIPTION OF RELATED ART

Examples of patents related to the present invention are as follows, and each patent is herein incorporated by reference for the supporting teachings:

U.S. Pat. No. 4,945,399, is an electronic package with integrated distributed decoupling capacitors.

U.S. Pat. No. 5,557,502, is a ball grid array package.

U.S. Pat. No. 4,300,115, is a multi-layer via resistor.

U.S. Pat. No. 4,658,234, is a resistor network.

U.S. Pat. No. 5,621,619, is an all ceramic surface mount sip and dip network having spacers and solder barriers.

U.S. Pat. No. 5,379,190, is a chip type composite electronic part and manufacturing method.

U.S. Pat. No. 4,332,341, is a fabrication of circuit packages using solid phase solder bonding.

U.S. Pat. No. 5,539,186, is a temperature controlled multi-layer module.

U.S. Pat. No. 5,216,404, is a SIC thin film thermistor.

U.S. Pat. No. 4,654,628, is a network resistor unit.

U.S. Pat. No. 5,661,450, is a low inductance termination resistor array.

The foregoing patents reflect the state of the art of which the applicant is aware and are tendered with the view toward discharging applicant's acknowledged duty of candor in disclosing information that may be pertinent in the examination of this application. It is respectfully stipulated, however, that none of these patents teach or render obvious, singly or when considered in combination, applicant's claimed invention.

SUMMARY OF THE PREFERRED EMBODIMENT(S)

It is a feature of the invention to provide a resistor network with solder sphere connections. Specifically, there is a substrate with several resistors and conductors arranged in a configuration. Solder spheres are used to connect the resistors to other electronic circuitry such as a printed circuit board.

It is a feature of the invention to provide a substrate having a top and a side surface. A resistor is located on the side surface. A first conductor is disposed on the side surface, and is electrically connected to one end of the resistor. A second conductor, is disposed on the top surface, and is electrically connected to the first conductor. The other end of the resistor is connected in the same manner to a third and fourth conductor. The second conductor has a cavity. A solder sphere is partially disposed in the cavity and is electrically and mechanically connected to the second conductor. A cover coat is disposed over the first conductor, third conductor and the resistor. A solder paste is located between the solder sphere and the second conductor. The solder paste electrically and mechanically connects the solder sphere to the second conductor.

The invention resides not in any one of these features per se, but rather in the particular combination of all of them herein disclosed and claimed and it is distinguished from the prior art in this combination of all of its structures for the functions specified.

There has thus been outlined, rather broadly, the more important features of the invention so that the detailed description thereof that follows may be better understood, and so that the present contribution to the art may be better appreciated. There are, of course, additional features of the invention that will be described hereinafter and which will form the subject matter of the appended claims. Those skilled in the art will appreciate that the preferred embodiment may readily be used as a basis for the designing of other structures, methods and systems for carrying out the several purposes of the present invention. It is important, therefore, that the claims are regarded as including such equivalent constructions since they do not depart from the spirit and scope of the present invention.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the accompanying drawings. The description of the invention may contain, for example, such descriptive terms as up, down, top, bottom, right or left. These terms are meant to provide a general orientation of the parts of the invention and are not meant to be limiting as to the scope of the invention.

DETAILED DESCRIPTION OF THE PREFERRED EMBODIMENT

Figure 1:
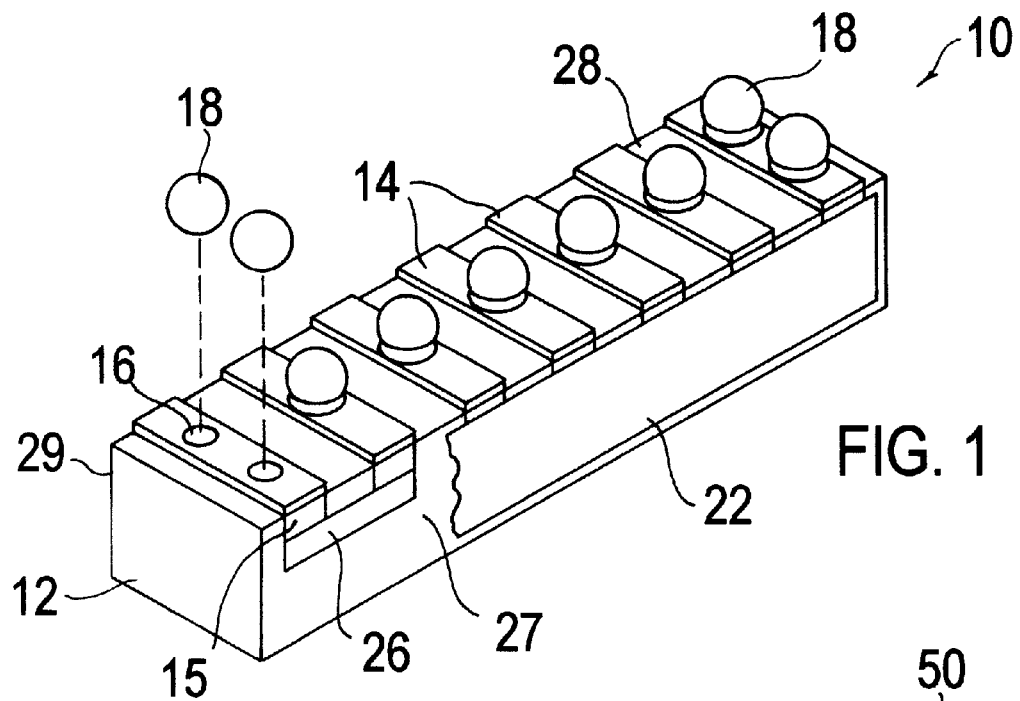
FIG. 1 is an exploded view of a resistor network having a single row of solder spheres.
Figure 2:
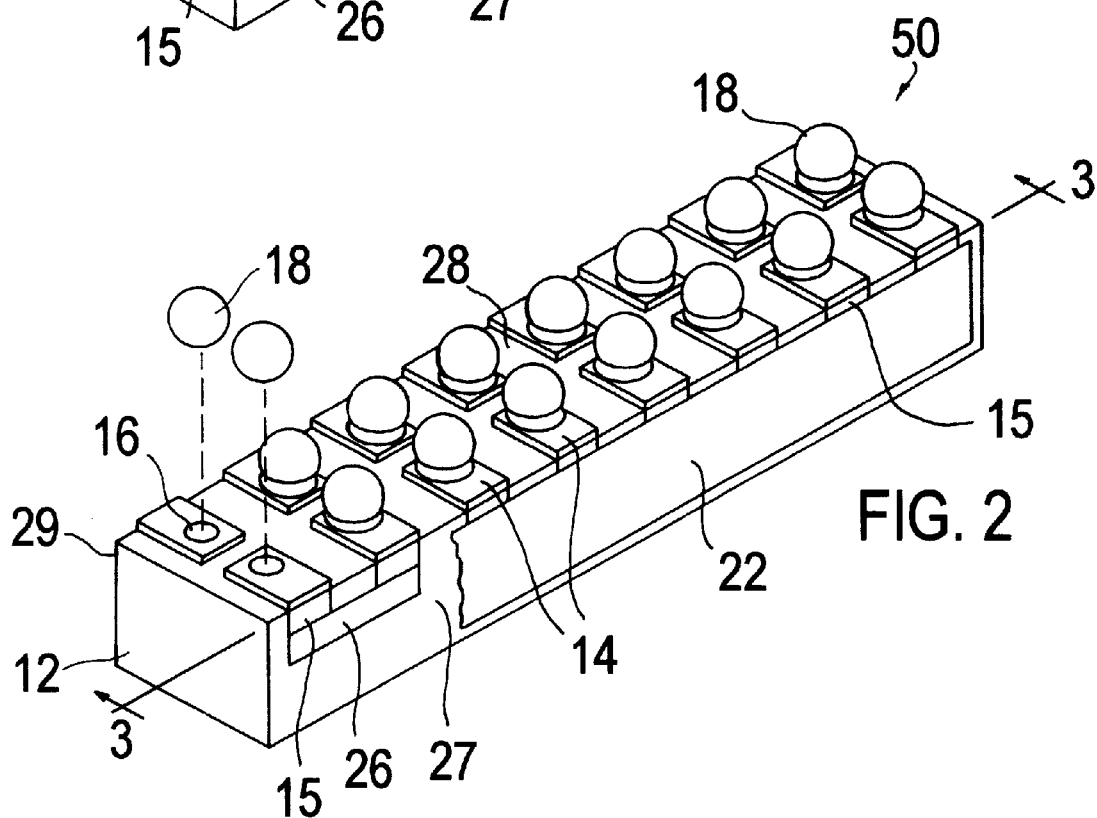
FIG. 2 is an exploded view of a resistor network having a dual row of solder spheres.
Figure 3:
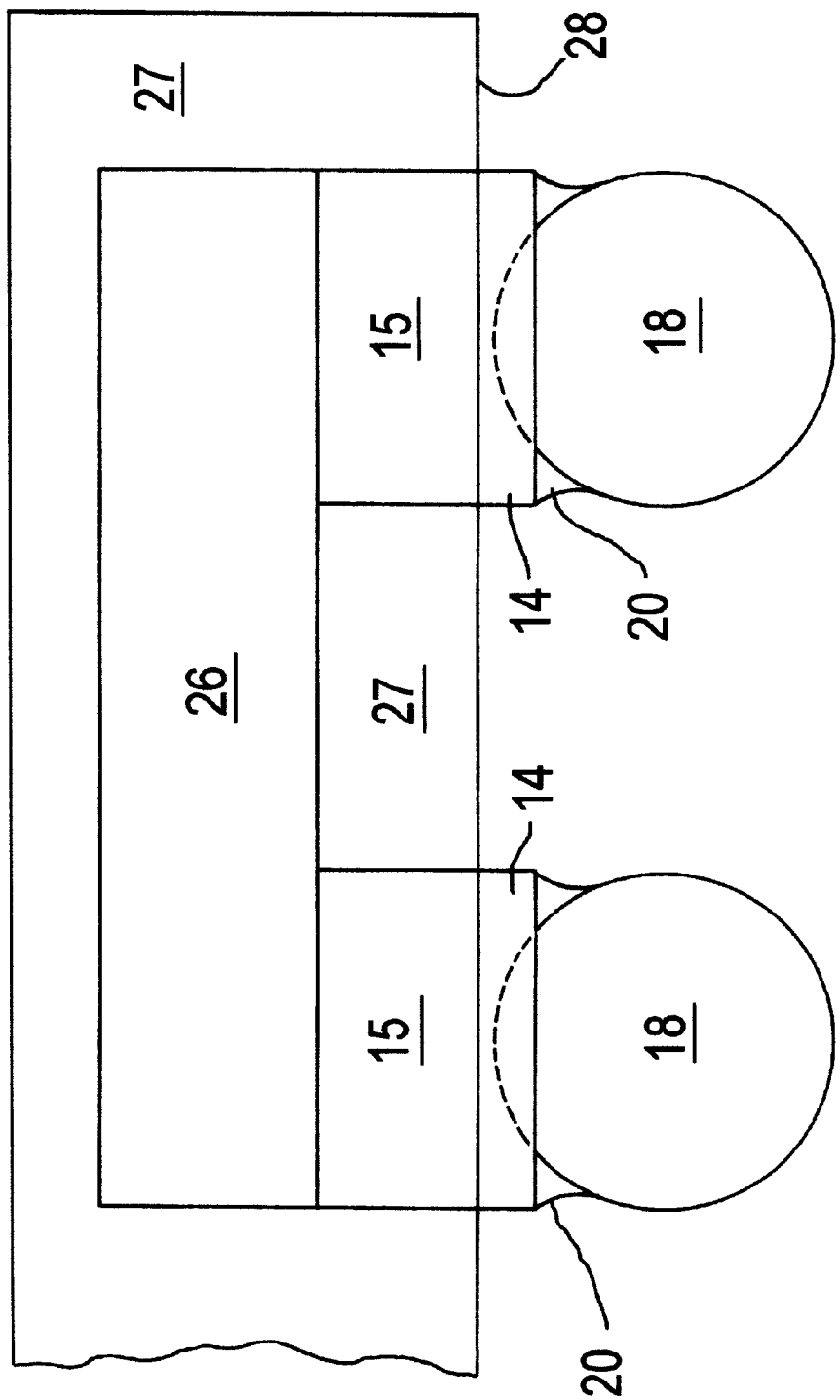
FIG. 3 is a partial side view of the resistor network of FIG. 2 along line 3—3 with the cover coat removed.

Referring to FIGS. 1, 2 and 3, there is a resistor network with solder sphere connections 10 and 50. Network 10 is a single row version and network 50 is a dual row version. In particular, resistor network assembly 10 has a rectangular substrate 12 having a top surface 28 and a first side surface and a second side surface 29 27. Substrate 12 is preferably made out of a ceramic material such as alumina oxide. Resistor 26 is disposed on side surface 27 Conductors 15 are located on side surface 27 in electrical contact with resistor 26. Similarly, resistors 26 and conductors 15 are also located on second side surface 29. Conductors 14 are located on top surface 28 and are electrically connected to conductors 15 at the edge of substrate 12. Conductor 14 has one or more cavities 16 formed therein. Cavities 16 may be omitted. Conductors 14, 15 and resistors 26 slightly overlap and sinter to form a mechanical and electrical bond during processing. Resistors 26, conductors 14 and 15 are formed using conventional thick film materials and processing techniques. The resistors 26 can have their resistance modified to a more accurate value by laser trimming if desired. A cover coat 22 is applied over resistor 26 and conductor 15 for protection.

Solder spheres 18 partially rest in cavities 16 and are mechanically and electrically attached to conductor 14 by a solder paste 20. Cavity 16 helps to hold the solder sphere in place and prevents it from rolling off during manufacturing. Solder spheres 18 may be 10% tin and 90% lead and are commercially available from Alpha Metals Corporation. The solder spheres can be other alloys such as 5–20% tin and 80–95% lead. Solder spheres are attached to conductors 14, using solder paste 20 which has a lower melting point than the solder sphere 18. Solder sphere 18 typically connects to an external electrical circuit (not shown) such as on a printed circuit board. The solder spheres 18 provide more compliance to absorb thermal expansion mismatches between network 10 or 50 and a printed circuit board than is provided by a standard solder joint. Solder sphere 18 are spaced apart to stably support substrate 12 and prevent tipping when it is mounted on a printed circuit board.

Resistor network assemblies 10 and 50 are assembled by the following process sequence:

Conductors 15 are screened onto side surface 27 and fired in an oven at between 700 to 900 degrees Celsius. The resistors 26 are screened onto side surface 27 and fired in an oven at between 700 and 900 degrees Celsius. Conductors 14 are deposited onto top surface 28 and fired in an oven at between 600 and 900 degrees Celsius. Next, the resistors 26 are laser trimmed to their proper resistance value and a cover coat 22 is screened on and cured. Solder paste is screened onto conductors 14. Solder spheres 18 are placed onto conductors 14 and reflowed to bond to conductors 14. Finally, the assembly is tested.

VARIATIONS OF THE PREFERRED EMBODIMENTS(S)

One of ordinary skill in the art of making resistors, will realize that there are many different ways of accomplishing the preferred embodiment. For example, although it is contemplated to make substrate 12 out of ceramic, other suitable materials would work, like polyamide or FR4. These materials would require a different resistor system. Additionally, although only one resistor was shown on substrate 12, more resistors could be placed. Additionally more or fewer rows of solder spheres could be used.

It is further possible to have other electrical connections to the resistor other than conductors 14 and 15. It is possible to use staked copper or metal pins.

The specification has shown the resistor network assembly with a cover coat 22. It is contemplated, however, to omit the cover coat.

It is possible to omit screening the cavity 16 during screening of conductor 14 and to place the solder ball directly on conductor 14.

It is contemplated to screen and fire a glass insulator between the conductors. Further, it is contemplated that the glass insulator could be placed over the entire surface 28 including conductors 14. Holes would be placed in the glass to provide an opening to solder the solder balls 18 to conductors 14.

Another variation of the preferred embodiment is to use other types of solder preforms in place of solder spheres 18. For example, solder donuts or wire or squares could be used. Further, the solder could be made from materials other than tin/lead. For example, a mixture of tin/indium or tin/bismuth could be used if a lower melting solder is desired. A mixture of tin/silver or tin/antimony could be used if a higher temperature solder is desired.

Further, the steps of processing sequence could be modified from that shown in the specification to produce the same end result. For example, resistors 26 could be placed before conductors 15.

If desired, other electrical elements could be added to resistor network 10 or 50 such as capacitors or inductors to make a filter, for example.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A resistor network, for mounting to a circuit board, comprising:
   a) a ceramic substrate having a first and second parallel side surfaces and a top surface that is perpendicular to the first and second side surfaces;
   b) at least two thick film resistors, one of the resistors disposed on the first side surface and the other resistor disposed on the second side surface, the resistors each having an end;
   c) a plurality of first thick film conductors, disposed on the first and second side surfaces, and electrically connected to each end of the resistors, respectively;
   d) a plurality of second thick film conductors, disposed on the top surface and adjacent to each other, the second conductors electrically connected to the first conductors on the first and second side surfaces, the second conductors each having a cavity formed therein;
   e) a cover coat that is disposed over the entire first and second side surfaces to protect the resistors;
   f) at least two high melting point solder spheres, consisting of between 5 to 20 percent tin and between 80 to 95 percent lead are partially disposed in the cavities, and electrically and mechanically connected to the second conductors for electrically connecting the conductors to the circuit board, the solder spheres located adjacent each other on the top surface such that the solder spheres stabilize the resistor network when it is mounted to the circuit board; and
   g) a low melting point reflowed solder paste, disposed within each cavity, the reflowed solder paste electrically and mechanically connecting the solder sphere to the second conductors.

* * * * *